United States Patent
Tsang (10) Patent No.: US 6,982,916 B2
(45) Date of Patent: Jan. 3, 2006

(54) METHOD AND SYSTEM FOR PROVIDING TEMPERATURE DEPENDENT PROGRAMMING FOR MAGNETIC MEMORIES

(75) Inventor: David Tsang, Cupertino, CA (US)

(73) Assignee: Applied Spintronics Technology, Inc., Cupertino, CA (US)

( * ) Notice: Subject to any disclaimer, the term of this patent is extended or adjusted under 35 U.S.C. 154(b) by 0 days.

(21) Appl. No.: 10/778,781

(22) Filed: Feb. 12, 2004

(65) Prior Publication Data

US 2005/0180239 A1    Aug. 18, 2005

(51) Int. Cl.
*G11C 7/04* (2006.01)

(52) U.S. Cl. ...................... 365/213; 365/211
(58) Field of Classification Search ........... 365/213, 365/211, 171, 173, 158
See application file for complete search history.

(56) References Cited

U.S. PATENT DOCUMENTS

| | | | |
|---|---|---|---|
| 6,577,549 B1 * | 6/2003 | Tran et al. | 365/211 |
| 6,608,790 B2 * | 8/2003 | Tran et al. | 365/211 |
| 6,687,178 B1 * | 2/2004 | Qi et al. | 365/211 |
| 6,775,196 B2 * | 8/2004 | Perner et al. | 365/211 |
| 6,834,010 B1 * | 12/2004 | Qi et al. | 365/185.05 |
| 6,868,025 B2 * | 3/2005 | Hsu | 365/211 |

* cited by examiner

*Primary Examiner*—Anh Phung
(74) *Attorney, Agent, or Firm*—Sawyer Law Group LLP (57) ABSTRACT

A method and system for programming a magnetic memory including a plurality of magnetic elements is disclosed. The method and system include sensing a temperature of the magnetic memory and providing an indication of the temperature of the magnetic memory. The method and system also include providing a current that is based on the indication of temperature of the magnetic memory. The current is temperature dependent and can be used in programming at least a portion of the magnetic elements without the addition of a separately generated current. In addition, the method and system include carrying for at least a portion of the plurality of magnetic elements. The temperature is preferably sensed by at least one temperature sensor, while the current is preferably provided by a current source coupled with the temperature sensor(s).

22 Claims, 8 Drawing Sheets

METHOD AND SYSTEM FOR PROVIDING TEMPERATURE DEPENDENT PROGRAMMING FOR MAGNETIC MEMORIES

FIELD OF THE INVENTION

The present invention pertains to reading nonvolatile magnetic memories, such as a magnetic random access memory (MRAM), and more particularly to a method and system for more reliably programming data based upon the temperature of the magnetic memory.

BACKGROUND OF THE INVENTION

DRAM, FLASH, and SRAM are the three major conventional semiconductor memories on the market. The manufacturing cost of DRAM is the lowest. However, in addition to shortcomings such as the need for refreshment, relatively low speed and high power consumption, DRAM is volatile. Consequently, a DRAM loses data when the power is turned off. FLASH memory is non-volatility, but is very slow. The write cycle endurance for a FLASH memory is less than one million cycles. This write cycle endurance limits the application of FLASH memories in some high data rate market. SRAM is a fast memory. However, SRAM is volatile and takes too much silicon area per cell. In search of a universal random access memory that offers high speed, non-volatility, small cell area, and good endurance, many companies are developing thin film Magnetic Random Access Memories (MRAM).

Conventional MRAMs can be fabricated with a memory cells using a variety of magnetic elements, such as an Anisotropic Magnetoresistance (AMR) element, a Giant Magnetoresistance (GMR) element, and a Magnetic Tunneling Junction (MTJ) stack. For example, a conventional MTJ stack is relatively simple to manufacture and use. Consequently, an MRAM is used as the primary example herein.

The magnetic field for changing the orientation of the changeable magnetic vector is usually supplied by two conductive lines that are substantially orthogonal to each other. When electrical current passes through the two conductive lines at the same time, two magnetic fields associated with the current in the two conductive lines act on the changeable magnetic vector to orient its direction.

Figure 1A:
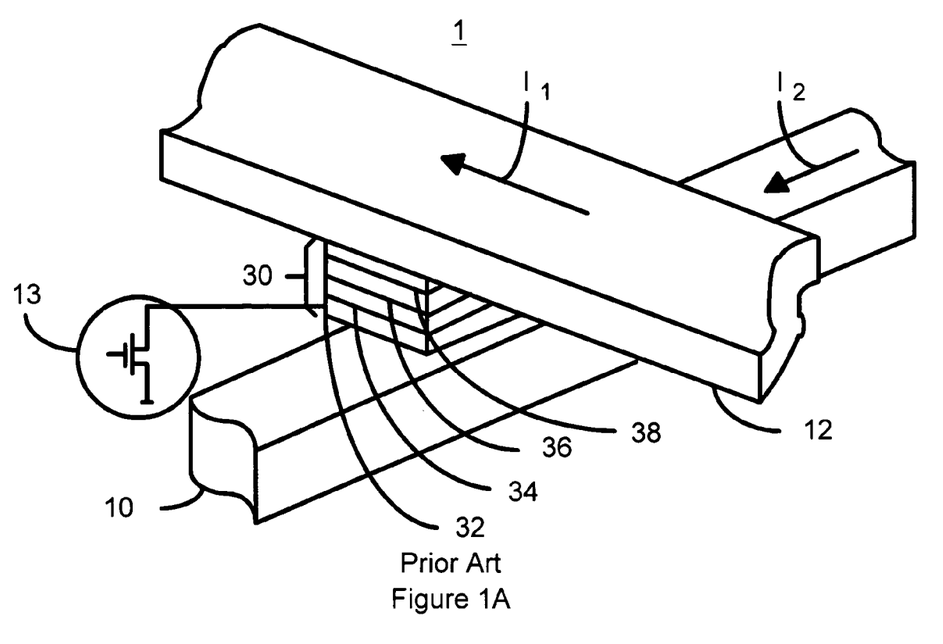
FIG. 1A is a three-dimensional view of a portion of a conventional magnetic memory including a MTJ cell, located at the intersection of a bit line and a word line.

FIG. 1A depicts a portion of a conventional MRAM 1. The conventional MRAM includes conventional orthogonal conductive lines 10 and 12, conventional magnetic storage cell having a MTJ 30 and conventional transistor 13. In some designs, the conventional transistor 13 is replaced by a diode, or completely omitted, with the conventional MTJ cell 30 in direct contact with the conventional word line 10. The conventional MRAM 1 utilizes a conventional magnetic tunneling junction (MTJ) stack 30 as a memory cell. Use of a conventional MTJ stack 30 makes it possible to design an MRAM cell with high integration density, high speed, low read power, and soft error rate (SER) immunity. The conductive lines 10 and 12 are used for writing data into the magnetic storage device 30. The MTJ stack 30 is located on the intersection of and between conventional conductive lines 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Layer 32 is usually a composite of seed layers and an antiferromagnetic (AFM) layer that is strongly coupled to the pinned magnetic layer. The AFM layer included in the layers 32 is usually Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction.

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Figure 1B:
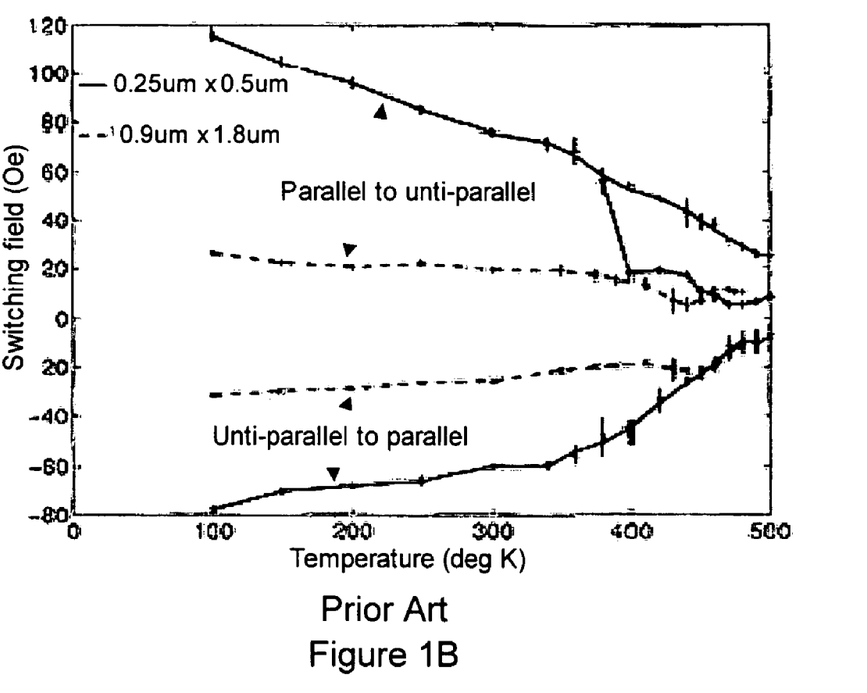
FIG. 1B is a graph depicting the switching field for conventional MTJ stacks versus temperature.

Although the conventional MRAM 1 functions, one of ordinary skill in the art will readily recognize that the conventional MRAM 1 is subject to malfunctions. The field and, therefore, the current required to write to the conventional MTJ stack 30 depends upon the temperature of the conventional MRAM 1. In particular, the amplitude of the magnetic field required to switch the direction of the changeable magnetic vector in free layer 38 depends upon the temperature of the free layer 38. FIG. 1B depicts a graph 50 of the switching field for conventional MTJ stacks 30 versus temperature. Referring to FIGS. 1A and 1B, the data shown in the graph 50 are for two devices having different dimensions. As indicated in the graph 50, for a 0.25 μm by 0.5 μm device, the switching field can change from eighty Oersteds to sixty Oersteds when the temperature changes from zero degrees centigrade (two hundred seventh three K) to one hundred degrees centigrade (three hundred and seventy three K). The switching field is the field at which the magnetic vector of the free layer 38 changes direction (for example from antiparallel to the magnetic vector of the pinned layer 34 to parallel to the magnetic vector of the pinned layer 34, or vice versa). Similarly, the 0.9 μm by 1.8 μm device, the switching field increases between zero and one hundred degrees centigrade. Furthermore, by comparing the data for the 0.9 μm by 1.8 μm device with the data for the 0.25 μm by 0.5 μm device, it can be seen that the temperature dependency of switching field increases when the device size decreases. Consequently, the switching field of small devices is more strongly dependent upon temperature than the switching field of large devices. This change in the switching field with temperature can cause the conventional MRAM 1 to malfunction if the same write field is used at all temperatures. The malfunction(s) may include but are not limited to not being able to write data when temperature drops or accidentally writing data into unselected cells. This problem is expected to become much more significant as device size decreases.

Accordingly, what is needed is a method and system for providing a write field that compensates for temperature changes in the MRAM device. The present invention addresses such a need.

SUMMARY OF THE INVENTION

The present invention provides a method and system for programming a magnetic memory including a plurality of magnetic elements. The method and system comprise sensing a temperature of the magnetic memory and providing an indication of the temperature of the magnetic memory. The method and system also comprise providing a current that is based on the indication of temperature of the magnetic memory. The current is temperature dependent and capable of being used in programming at least a portion of the plurality of magnetic elements without the addition of a separately generated current. In addition, the method and system comprise carrying the current for at least a portion of the plurality of magnetic elements. The temperature is preferably sensed by at least one temperature sensor, while the current is preferably provided by a current source coupled with the temperature sensor(s).

According to the system and method disclosed herein, the present invention provides a method and system for varying the current(s) used in programming magnetic elements based upon the temperature of the magnetic memory. As a result, performance of the magnetic memory can be improved.

DETAILED DESCRIPTION OF THE INVENTION

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

The present invention provides a method and system for programming a magnetic memory including a plurality of magnetic elements. The method and system comprise sensing a temperature of the magnetic memory and providing an indication of the temperature of the magnetic memory. The method and system also comprise providing a current that is based on the indication of temperature of the magnetic memory. The current is temperature dependent and capable of being used in programming at least a portion of the plurality of magnetic elements without the addition of a separately generated current. In addition, the method and system comprise carrying the current for at least a portion of the plurality of magnetic elements. The temperature is preferably sensed by at least one temperature sensor, while the current is preferably provided by a current source coupled with the temperature sensor(s).

The present invention will be described in terms of particular types of magnetic memory cells, a particular configuration of elements, and particular magnetic elements. For example, the present invention will be described in the context of illustrative magnetic random access memory (MRAM) cells and MTJ stacks. One of ordinary skill in the art will, however, recognize that the present invention is not limited to any particular magnetic memory devices or magnetic memory element. Thus, one of ordinary skill in the art will readily realize that this method and system will operate effectively for other magnetic memory cells, and other magnetic elements and configurations non inconsistent with the present invention. For example, spin-valve giant magnetoresistive memory elements may be similarly used, with or without modification to the inventive memory architecture. In addition, although the present invention is described in the context of metal-oxide-semiconductor (MOS) devices and MTJ stacks, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. The embodiments in accordance with the present invention and described herein focus on a current source with negative temperature coefficient. However, one of ordinary skill in the art will readily recognize that a minor modification to the present invention could easily provide a current source with a positive temperature coefficient. Further, the present invention is described in the context of illustrative magnetic random access memory (MRAM) devices. However, one of ordinary skill in the art will readily recognize that the present invention is not limited to this or any particular magnetic memory devices. Rather, the present invention may be more generally applied to electronic devices in which it is desirable to provide a current source with the output being dependent on temperature. Furthermore, portions of the present invention are described as diodes. However, one of ordinary skill in the art will readily recognize that a diode connected transistor and a diode are typically interchangeable.

Figure 2:
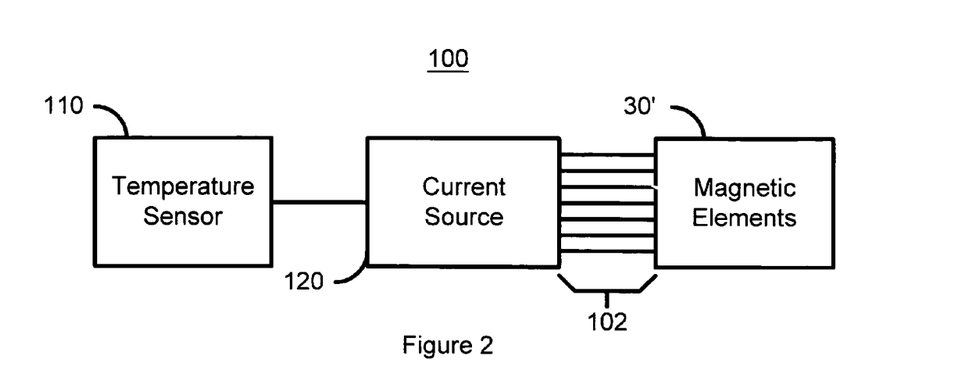
FIG. 2 depicts a high-level block diagram of one embodiment of a system for providing temperature dependent programming in accordance with the present invention.

To more particularly illustrate the method and system in accordance with the present invention, refer now to FIG. 2, depicting a high-level block diagram of one embodiment of a system 100 for providing temperature dependent programming in accordance with the present invention. The system 100 is coupled with magnetic elements 30', which are preferably coupled as depicted in FIG. 1A. However, nothing prevents the use of another configuration and other and/or additional components not depicted in FIG. 1A.

Referring back to FIG. 2, the temperature dependent programming system 100 includes at least one temperature sensor 110 that is coupled with and controls a current source 120. The current source 120 provides current to magnetic elements 30'. The magnetic elements 30' are analogous to the conventional MTJ stacks 30 depicted in FIG. 1A. Referring back to FIG. 2, conductive line(s) 102 carry the current provided by the current source to and/or in proximity to the magnetic elements 30'. Thus, the programming that occurs at the magnetic elements 30' (the fact that magnetic fields are generated using currents in two lines) is preferably analogous to the programming performed for the conventional MRAM 1. Thus, the current provided by the current source 120 is temperature dependent and capable of being used in programming at least a portion of the plurality of magnetic elements without the addition of a separately generated current. Stated differently, in a preferred embodiment, each current generated by the current source 120 is temperature dependent. However, nothing prevents the programming from being carried out in a different manner.

The temperature sensor(s) 110 sense the temperature of the MRAM for which the magnetic elements 30' are a part. This temperature corresponds to the temperature of the magnetic elements 30'. In a preferred embodiment, the temperature sensed by the temperature sensor(s) 100 corresponds to the temperature of the free layer (not explicitly shown) of the magnetic elements 30'. The temperature sensor(s) 110 also provide an indication of the temperature being sensed. The temperature sensor(s) 110 thus preferably provide a temperature signal that is indicative of the temperature of the magnetic memory. For example, the temperature sensor(s) 110 might provide a voltage or current that corresponds to the temperature that is sensed. In one embodiment, the temperature sensor(s) 110 have a positive temperature coefficient, providing a voltage or current that increases with increasing temperature. In another embodiment, the temperature sensor(s) 110 have a negative temperature coefficient, providing a voltage or current that decreases with increasing temperature.

The current source 120 is coupled with the temperature sensor 110. The current source 120 preferably receives the indication of the temperature provided by the temperature sensor 110. The current source 120 provides a current that depends upon the indication of the temperature provided by the temperature sensor 110. Preferably, the current provided by the current source 110 decreases with increasing temperature. In a preferred embodiment, the current source 120 includes a current mirror and a second current source that is coupled to the temperature sensor. The second current source provides a current that depends upon the temperature signal from the temperature sensor(s). The current mirror then provides a current that is based on the current through the second current source. The current provided by the current source 120 is provided through the conductive lines 102 to some portion of the magnetic elements 30'. The magnetic elements 30' might be spin-valve devices, magnetic tunneling junction devices or other magneto-resistive devices. Consequently, the current provided to the magnetic elements 30' depends upon the temperature of the magnetic memory.

Thus, using the system 100, a temperature dependent current can be provided during programming of one or more of the magnetic elements 30'. The temperature dependent current can be used to drive a magnetic field for programming the magnetic elements 30'. Thus, a magnetic field which depends upon the temperature is generated during programming of the magnetic elements 30'. As a result, an adequate field for switching the magnetic elements 30' at the temperature of the magnetic memory can be provided. Thus, malfunctions such as not being able to write data or inadvertently writing to unselected cells can be reduced or avoided.

Figure 3:
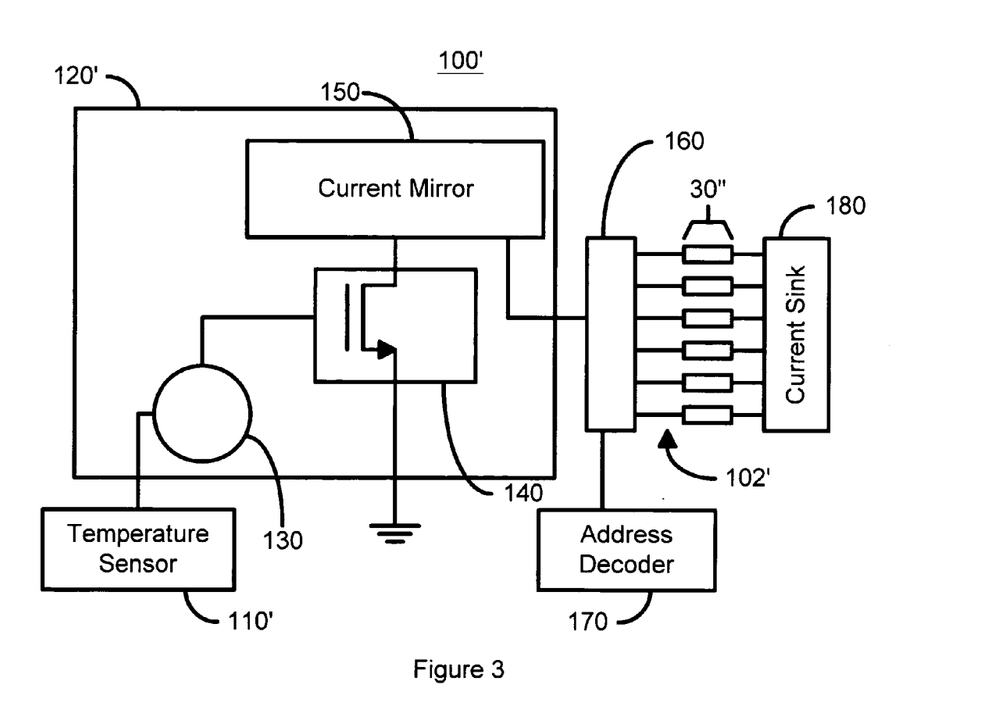
FIG. 3 depicts a more detailed diagram of one embodiment of a system for providing temperature dependent programming in accordance with the present invention.

FIG. 3 depicts a more detailed diagram of one embodiment of a system 100' for providing temperature dependent programming in accordance with the present invention. In addition to the system 100', magnetic elements 30' are also depicted. The system 100' includes temperature sensor(s) 110', a current source 120', switches 160, an address decoder 170 and preferably a current sink 180. The current source 120' includes a control signal source 130 that is preferably a voltage circuit 130. The current source 120' also includes a second current source 140 and a current mirror 150.

The temperature sensor 110' can include a number of different sensors such as diode-connected bipolar transistors, simply diodes, thermocouples and/or thermistors. In a preferred embodiment, however, diode-connected transistors or diodes are used. If other technology, such as thermocouples and/or thermistors are used, the temperature sensor 110' is not integrated into the silicon chip and is instead connected as an external device. In a preferred embodiment, the temperature coefficient (change in output signal of the temperature sensor 110' versus temperature) is negative. However, in an alternate embodiment, the temperature coefficient of the temperature sensor 110' could be positive. In order for the current provided by the current source 120' to decrease with increasing temperature, however, the system 100' is modified slightly. For example, the voltage drop across a forward biased pn-junction in silicon has a negative temperature coefficient of approximately −2 mV/K. This temperature coefficient can be used for an on-chip temperature measurement.

Easily accessible pn-junctions that could be used for the temperature sensor 110 are found in several semiconductor devices, such as bipolar transistors in BiCMOS technologies or in lateral and vertical bipolar devices in standard CMOS technologies. In case of bipolar technology, either an NPN or a PNP transistor connected as a diode. In case of CMOS technology, a substrate PNP or a substrate NPN can be utilized for n-well and p-well CMOS technologies, respectively. For the n-well technology, which is generally preferred CMOS technology in industry, the PNP transistor is formed by P+ diffusion inside the n-well and the p-type substrate. The P+ diffusion forms the emitter, the n-well forms the base and the p-type substrate forms the collector. Note that in these bipolar transistor structures that exist inherently in CMOS technologies, the collectors are not available as a separate terminal since they are formed by the common substrate, which is p-type for n-well CMOS and n-type for p-well CMOS technology. Furthermore, the pn-junction bias voltage has a negative temperature coefficient, which is preferable for the temperature sensor 110'. Thus, any of the above technologies may be suitable for use in the temperature sensor 110'.

The voltage circuit 130 is coupled to the temperature sensors 110' and receives an output from the temperature sensor(s) 110'. The output of the temperature sensor(s) 110' is a temperature signal that, for example, may be a voltage or current. The voltage circuit 130 receives the temperature signal as an input and produces a control signal. The control signal produced by the voltage circuit 130 is preferably a voltage, $V_{UPTAT}$. This voltage is preferably anti-proportional to the absolute temperature. Stated differently, the voltage provided by the voltage circuit 130 depends upon temperature and preferably has a negative temperature coefficient. Thus, the voltage preferably decreases as the temperature increases. The voltage output by the voltage circuit 130 is provided to the second current source 140.

The voltage circuit 130 is coupled to and is used to drive the second current source 140. The second current source is preferably a N-channel MOS (NMOS) transistor having its gate connected to the voltage circuit 130. The second current source 140 is controlled by the voltage, $V_{UPTAT}$, provided by the voltage circuit 130. In particular, the higher the voltage provided by the voltage circuit 130, the higher the source-drain current, $I_{DS}$, flowing through the second current source 140. The voltage provided by the voltage circuit 130 preferably decreases with increasing temperature, driving less current through the source-drain channel of the NMOS transistor used in the second current source 140. As a result, the second current source 140 preferably produces a current which decreases with increases in temperature of the magnetic memory. It should be noted that the NMOS transistor in the second current source 140 could be replaced with a PMOS transistor (not shown). Such a PMOS transistor may be desirable when the temperature sensor 110' has a positive temperature coefficient.

The current mirror 150 is coupled with the second current source 140. In the embodiment shown, the drain of the NMOS transistor is connected to the current mirror 150. The current mirror 150 drives an array of conductor lines 102' through the switch circuitry 160 controlled by the address decoder 170. The current mirror 150 takes the output current of the second current source 140 as an input. In a preferred embodiment, therefore, the source-drain current of the second current source 140 is provided to the current mirror 150. Based on the source-drain current from the second current source 140, the current mirror 150 provides a current. Preferably, this current is used in programming the magnetic elements 30", which might be spin-valve devices, magnetic tunneling junction devices or other magneto-resistive devices. The output amplitude of the current from the current mirror 150 is designed to be adequate to switch the magnetic state of the magnetic elements 30". Thus, the current from the current mirror 150 is carried by one or more of the lines 102' to some portion, including all, of the magnetic elements 30".

In order to determine which of the lines 102' carry the current, the address decoder 170 and switches 160 are used. The address decoder 170 determines which of the lines 102' is to carry the current and controls the switches 160 to connect the desired line(s) 102' to the current mirror 150. The current sink 180 is connected to the selected magnetic element(s) 30' through the appropriate one or more of the switch(es) 160 and the corresponding selected line(s) 102'. Thus, the current from the current mirror 150 can be provided to the desired magnetic element(s) 30'. The desired magnetic element(s) can thus be programmed.

Figure 4A:
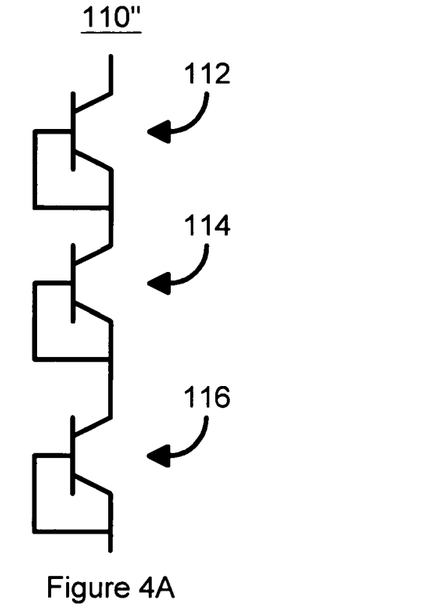
FIG. 4A depicts one embodiment of a temperature sensor in accordance with the present invention for use in providing temperature dependent programming in accordance with the present invention.
Figure 4B:
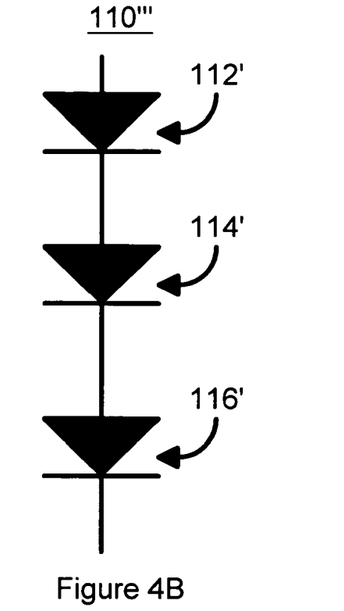
FIG. 4B depicts a second embodiment of a temperature sensor in accordance with the present invention for use in providing temperature dependent programming in accordance with the present invention.

FIGS. 4A and 4B depict preferred embodiments of temperature sensors 110" and 110''', respectively, in accordance with the present invention. The temperature sensor 110" includes diode-connected bipolar transistors 112, 114, and 116. The temperature sensor 110''' includes diodes 112', 114', and 116'. Although three transistors 112, 114, and 116 and three diodes 112,', 114', and 116' are shown, nothing prevents the use of another number of transistors 112, 114, and 116 or diodes 112', 114', and 116'. The temperature sensors 110" and 110''' are preferred because these temperature sensors can be formed on silicon and, therefore, incorporated into the magnetic memory during fabrication. Thus, the temperature sensors 110" and 110''' can be used for an on-chip measurement of temperature.

The voltage drop across a forward biased pn-junction in silicon depends on temperature with a gradient of approximately −2 mV/K. The forward bias of a typically pn-junction is approximately 0.7 V. If the temperature changes by one hundred degrees centigrade, the percentage change of the forward bias is −200/700, or approximately a twenty-eight percent. Twenty-eight percent is a significant change. Easily accessible pn-junctions are found in several semiconductor devices, as described above.

For the temperature sensor 110", at room temperature, the voltage drop across the three diode-connected forward-biased bipolar transistors 112, 114, and 116 is approximately 2.1 V. At one hundred and twenty five degrees centigrade, the forward bias drops to about 1.4 V, which is still above the threshold of the NMOS transistor used in the current source 140. As a result, the current source 120' operates in the linear range. Moreover, advances in CMOS technology decrease the voltage of the power supply for each succeeding generation. The threshold voltage of CMOS transistors is also decreasing in a similar fashion. In the future, therefore, fewer of pn-junctions 112, 114, and 116 could be used for the temperature sensor 110", while still providing similar performance.

Figure 5A:
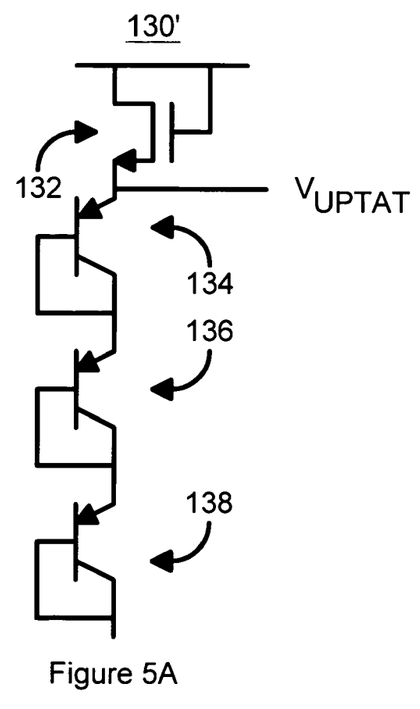
FIG. 5A depicts one embodiment of a voltage source for use in a system for use in providing temperature dependent programming in accordance with the present invention.

FIG. 5A depicts a preferred embodiment of a voltage circuit 130' for use in providing temperature dependent programming in accordance with the present invention. The voltage circuit 130' includes transistor 132 and diodes 134, 136, and 138. For clarity, the voltage circuit 130' is described in the context of the system 100' and is assumed to be used for the voltage circuit 130 depicted in FIG. 3. Referring to FIGS. 3 and 5A, the voltage circuit 130' receives the output of the temperature sensor 110, 110', 110", or 110''' as an input and provides a temperature-dependent voltage output, $V_{UPTAT}$. The voltage provided by the voltage circuit 130' preferably has a negative temperature coefficient.

A temperature sensitivity that is different from that of the voltage circuit 130' may be desired to be used in different embodiments of the system 100'. For example, as indicated in the graphs 50 of FIG. 2, the change in switching field with temperature may not be a linear function and the rate of change of the switching field may not be the same for devices with different sizes. However, the systems 100 and 100' depicted in FIGS. 2 and 3, as well as the systems 100" and 200, depicted in FIGS. 7 and 8 and described below, can still be utilized. In such systems, a greater or lesser change in the temperature sensitivity of the voltage circuit 130' may be desired.

Figure 5B:
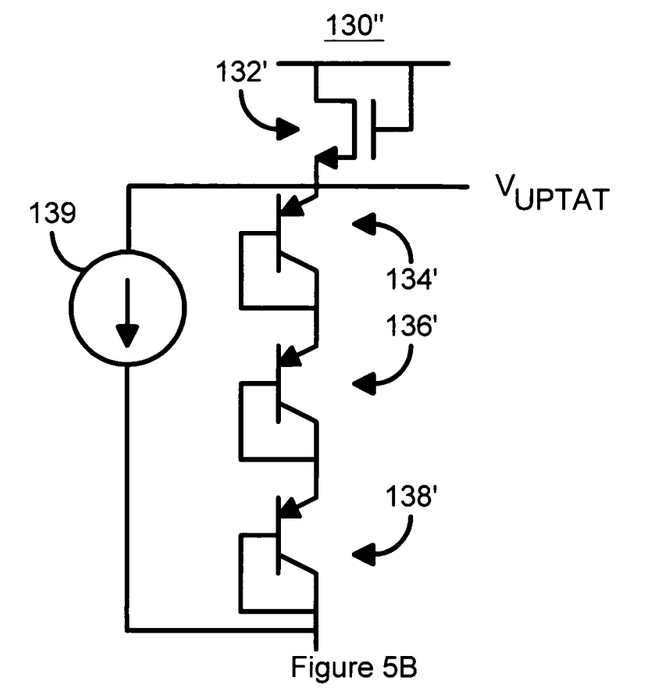
FIG. 5B depicts a second embodiment of a voltage source for use in a system for use in providing temperature dependent programming in accordance with the present invention.

FIG. 5B depicts a second embodiment of a voltage circuit 130" for use in a system for use in providing temperature dependent programming in accordance with the present invention. The voltage circuit 130" shown in FIG. 5B provides a greater change in $V_{UPTAT}$ (a greater temperature sensitivity) than the voltage circuit 130' depicted in FIG. 5A. Referring to FIGS. 5A and 5B, the voltage circuit 130" includes analogous components to the voltage circuit 130'. Consequently, these components are labeled similarly. The voltage circuit 130" also includes a current source 139. The current source 139 produces a current, $I_{PTAT}$, that is proportional to the absolute temperature. Consequently, when the transistor 132' produces more current at high temperature, the additional current can be bypassed by current source 139. As a result, the current passing through the diodes 134', 136', and 138' does not have to increase, or may be designed to decrease, yielding a greater change in $V_{UPTAT}$ with temperature.

Figure 5C:
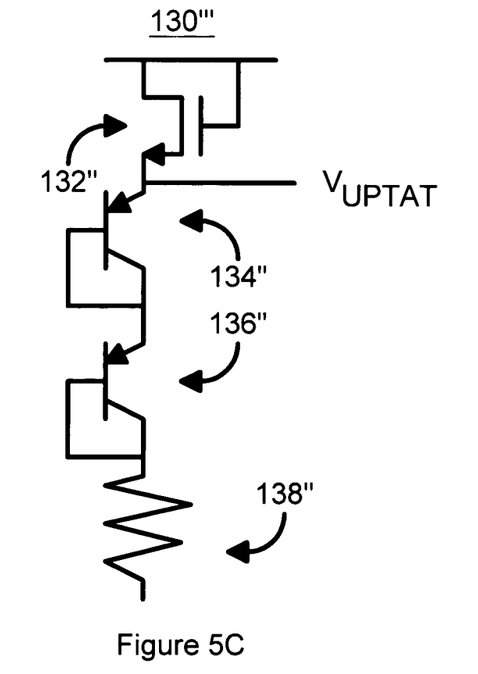
FIG. 5C depicts a third embodiment of a voltage source for use in a system for use in providing temperature dependent programming in accordance with the present invention.

FIG. 5C depicts a third embodiment of a voltage circuit 130''' for use in a system for providing temperature dependent programming in accordance with the present invention. The voltage circuit 130''' produces a lower change in the output voltage, $V_{UPTAT}$ (a lower temperature sensitivity) than the voltage circuit 130' depicted in FIG. 5A. Referring to FIGS. 5A and 5C, the voltage circuit 130''' includes transistor 132''' and diodes 134" and 136". These components are preferably the same as the transistor 132 and diodes 134 and 136. However, in lieu of the diode 138, the voltage circuit 130''' utilizes a resistor 138". Because of the use of the resistor 138", the change in output voltage with temperature is reduced. Stated differently, the resistor 138" decreases the temperature sensitivity of the output of the voltage circuit 130'''.

Figure 6:
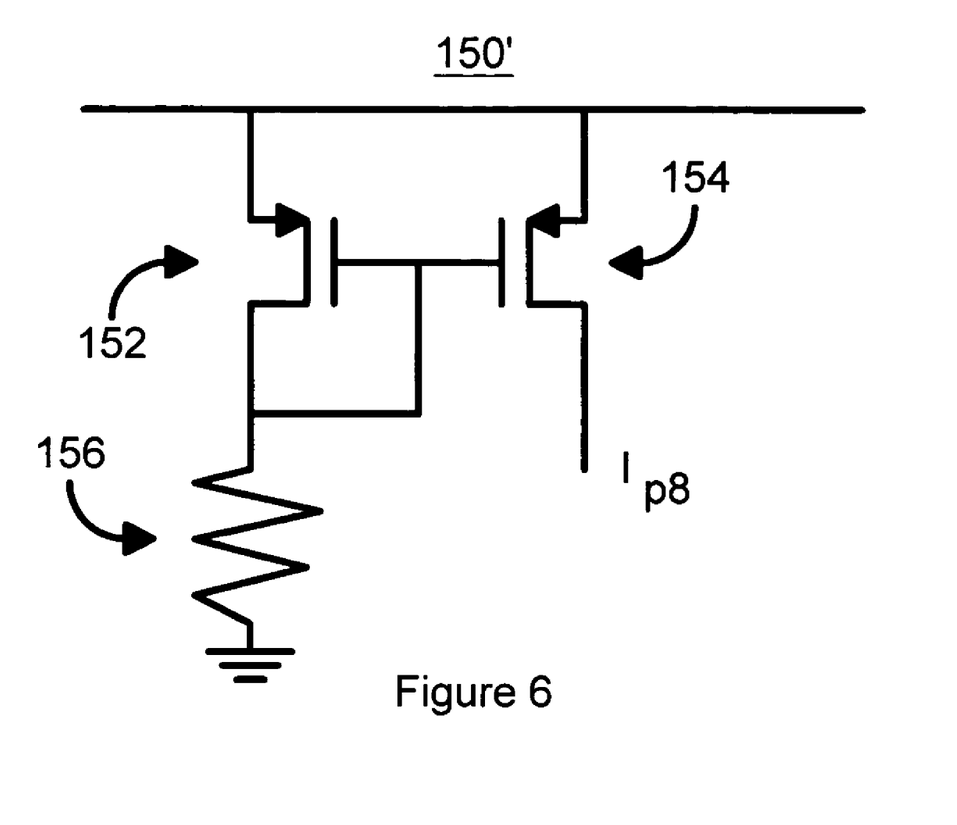
FIG. 6 depicts one embodiment of a current mirror for use in a system for use in providing temperature dependent programming in accordance with the present invention.

FIG. 6 depicts one embodiment of a current mirror 150' for use in a system for use in providing temperature dependent programming in accordance with the present invention. The current mirror includes transistors 152 and 154, as well as resistor 156, which is connected to ground.

Referring to FIGS. 3, 5A, and 6, the functioning of a preferred embodiment of the system 100 is described. First, a simplified estimate of the voltage produced by the voltage circuit 130' based on some well known CMOS transistor and diode characteristics is as follows. It is assumed that a five volt power supply (not shown) is used in the magnetic memory, the NMOS transistor for the second current source 140 has a one volt threshold voltage, $V_{th}$, and a diode 134, 136, or 138 has a 0.7 V forward bias, $V_{be}$, at room temperature. It is also assumed that the temperature coefficient of the threshold voltage for the second current source 140 is $-2.5$ mV/° C. and the temperature coefficient of the forward bias voltage of the diode 134, 136, or 138 is $-2$ mV/° C. The current in the NMOS transistor for the second current source 140 can be expressed as $I_{n140}=k(V_{gs}-V_{th})^2$, where k is a constant and dependent on the channel width and length. With a temperature increase of one degree centigrade, the forward bias of the diodes decreases by, to the first order, six millivolts. Consequently $V_{gs}$ increases by about six millivolts. The percentage increase of $I_{n140}$ is roughly one point one percent. This increase in current will cause the forward bias of the diodes to increase by $(KT/q)*\Delta I/I * 3$(three diodes)= 26 mV*0.011*3=0.86 mV.

Therefore, the effective change in $V_{UPTAT}$ is approximately $-4.14$ mV per degree centigrade around room temperature. Thus, the voltage output by the voltage circuit 130' does increase with decreasing temperature. Note that the above calculation is only a first order estimate to show how this circuit functions. A more accurate calculation can be done using self-consistent method.

The output of the voltage circuit 130', $V_{UPTAT}$, drives the gate of an NMOS transistor that serves as the second current source 140. Thus, the voltage output by the voltage circuit 130 is also the gate bias of the NMOS transistor in the second current source 140 decreases. A decrease in the gate bias causes less current go through the source-drain channel of the NMOS transistor in the second current source 140. The percentage change per degree centigrade at around room temperature is $\Delta V_{UPTAT}/(V_{gs}-V_{th})=-4.14/(2100-1000)= 0.37\%/°$ C. To the first order, a thirty-seven percent change in the current amplitude could be achieved with a one hundred degree centigrade temperature change.

The drain of the NMOS transistor for the second current source 140 is connected to the current mirror 150', which drives an array of conductor lines 102' through switches 160. The current mirror 150' preferably includes the two PMOS transistors 152 and 154. A current flowing in the transistor 152 corresponds to $V_{GS152}$, the gate-to-source voltage of the transistor 152. Because $V_{GS154}$, the gate-to-source voltage of the transistor 154, is the same as $V_{GS152}$, ideally the same current or a multiple of the current in the transistor 152 flows through the transistor 154. If the transistors 152 and 154 are the same size, the same drain current flows in each transistor 152 and 154, provided the transistor 154 operates in the saturation region. The current in the transistor 152 is given by $I_{p152}=k_{152}(V_{GS152}-V_{th152})$, where $k_{152}$ is a constant that depends on the channel width and length. The current in through the transistor 154 is given by $I_{p154}=k_{154}(V_{GS154}-V_{th154})$. In addition, $V_{GS152}$ is equal to $V_{GS152}$ and $V_{th152}$ is approximately equal to $V_{th154}$. Consequently, the ratio between the drain current of the two PMOS transistors is:

$I_{p154}/I_{p152}=k_{154}/k_{152}=(W_{154}L_{152}/W_{152}L_{154})$, where $W_{152}$ and $W_{154}$ are the channel width of transistors 152 and 154, respectively, and $L_{152}$ and $L_{154}$ are the channel lengths of the transistors 152 and 154, respectively. The equation directly above shows how to adjust the channel size of the transistor 154 to achieve the desired output current. Thus, the desired current for programming the magnetic elements 30' in the operating temperature range may be achieved.

Figure 7:
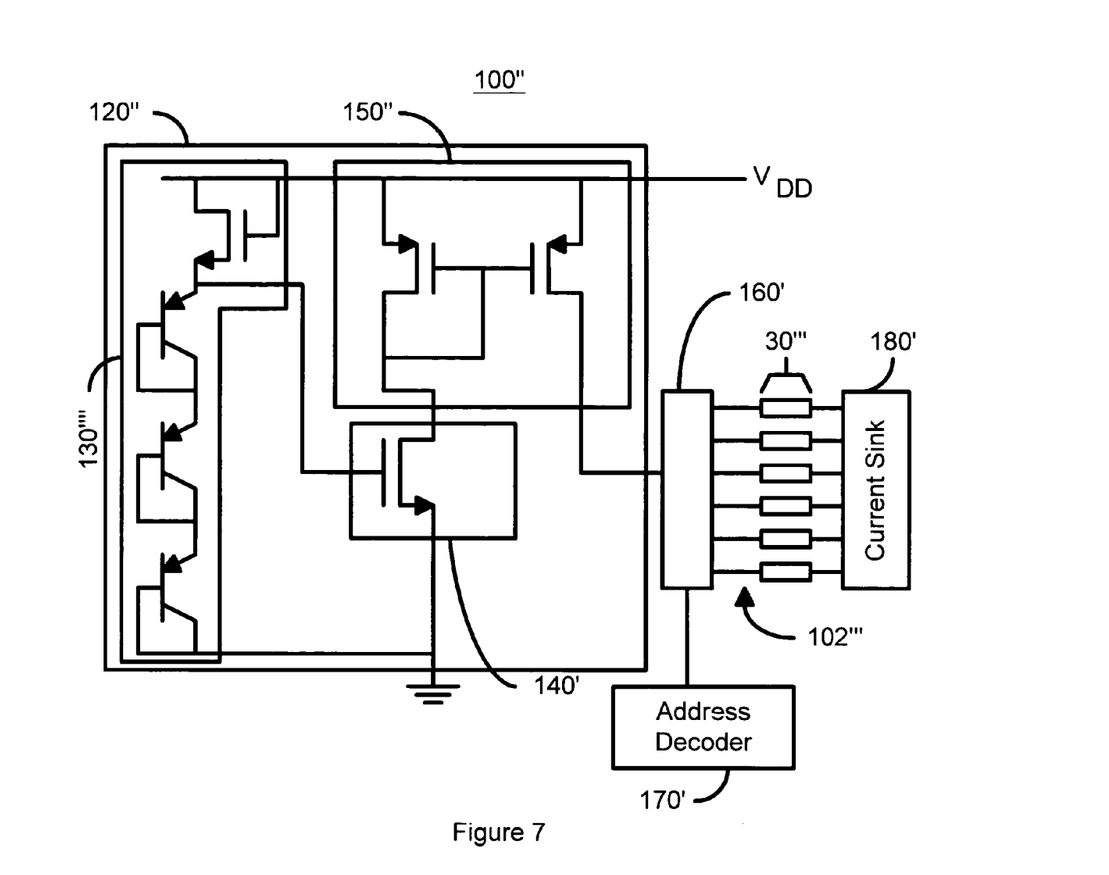
FIG. 7 depicts a more detailed diagram of a second embodiment of a system for providing temperature dependent programming in accordance with the present invention.

FIG. 7 depicts a more detailed diagram of a second embodiment of a system 100" for providing temperature dependent programming in accordance with the present invention. The components of the system 100" are analogous to the system 100' and are, therefore, labeled similarly. The system 100" thus includes voltage circuit 130"" (which is the same as the voltage circuit 130' depicted in FIG. 5A), second current source 140' (which is the same as the second current source 140 depicted in FIG. 3), current mirror 150", switches 160', address decoder 170', and lines 102". The magnetic elements 30''' are coupled to the switch 160' and current sink 180' through lines 102".

In the system 100" depicted in FIG. 7, the drain current of the transistor 154" is directed to one or more of the lines 102" through a switch circuit which is controlled by the address decoder 170'. The address decoder 170' decodes the address signal and decide which memory cell(s) or, equivalently, which write line(s) of the lines 102" should be connected with the output of the current mirror 140". The current-carrying conductor line of the lines 102" produces a magnetic field for writing data into the magnetic elements 30''', which can be spin-valve devices, magnetic tunneling junction devices or other magneto-resistive devices. The output amplitude of the current mirror is designed to be adequate to switch the magnetic state of each of the magnetic elements 30'''. Using the system 100" depicted in FIG. 7, a unidirectional current and can be used for producing the bias field for the magnetic elements 30'''.

Figure 8:
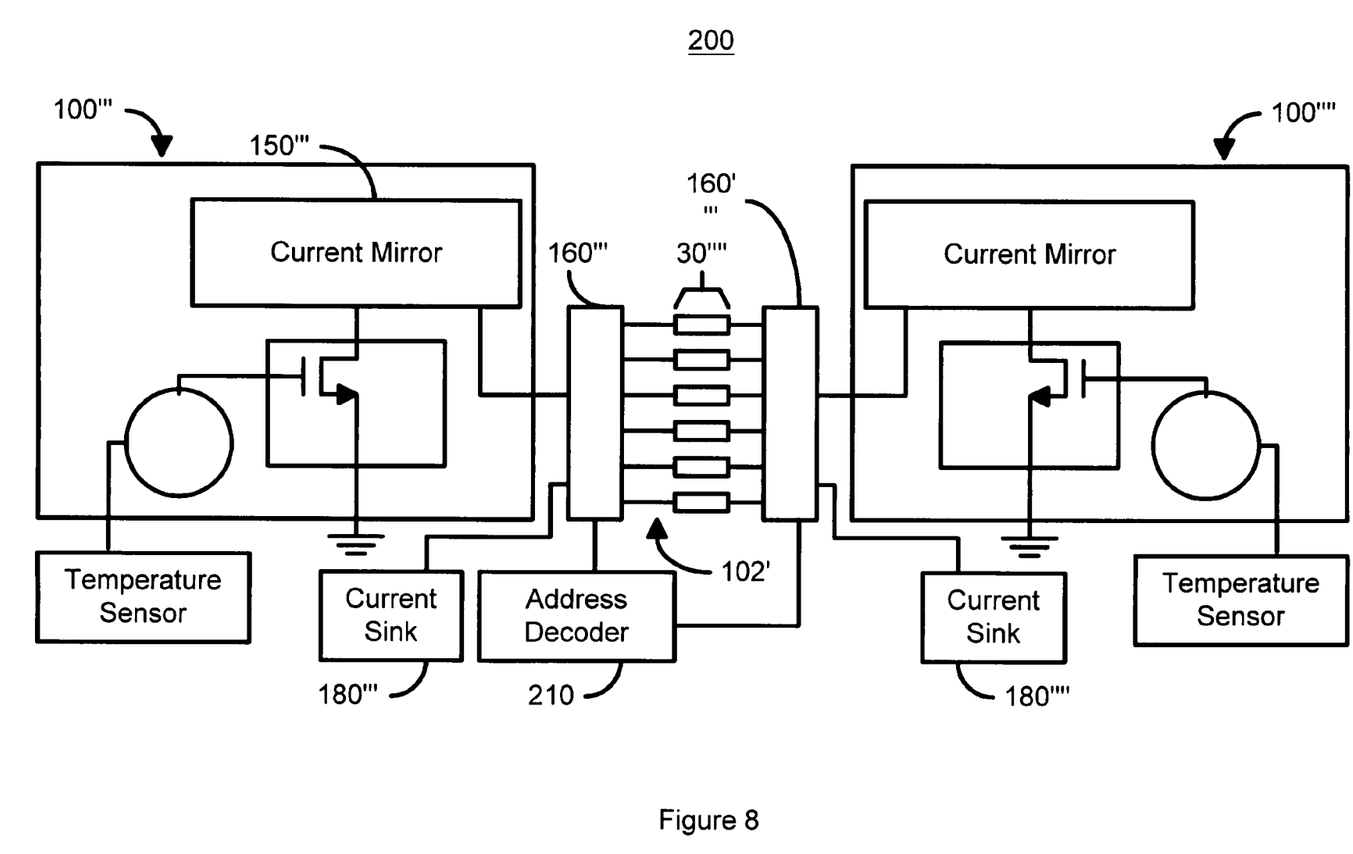
FIG. 8 depicts a more detailed diagram of a third embodiment of a system for providing temperature dependent programming in accordance with the present invention.

FIG. 8 depicts a more detailed diagram of a third embodiment of a system 200 for providing temperature dependent programming in accordance with the present invention. The system 200 can provide a bi-direction current to the magnetic elements 30''''. The system 200 includes two version of the system 100', termed current source A 100''' and current source B 100''''. The systems 100''' and 100'''' may include portions or all of the systems 100 and 100' previously described. Hoewver, the current mirrors 100''' and 100'''' share an address decoder 210. When the address decoder directs the switches 160''' and 160'''' to connect the current sink 180''' with the current mirror 100'''', a current flowing from right to left is generated. A current in the opposite direction can be generated by connecting the current mirror 150''' and the current sink 180''' on the same one of the lines 102'''. The data bit signal could be used to trigger the switches for changing the current direction. Thus, a bi-directional, temperature dependent current may also be provided.

Using the systems 100, 100', 100" and 200, the method and system in accordance with the present invention provide a temperature dependent current. In a preferred embodiment, the current increases with decreasing temperature. The current can be used to generate magnetic field and program memory elements, such as the elements 30, 30', 30", and 30'''. As a result, functions due to the use of currents that are too large or too small for a particular operating temperature can be avoided.

A method and system has been disclosed for an improved magnetic memory and method for reading a magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for programming magnetic memory including a plurality of magnetic elements, the system comprising:
    at least one temperature sensor for sensing a temperature of the magnetic memory and providing an indication of the temperature of the magnetic memory, the at least one temperature sensor including at least one diode-connected transistor having at least one emitter-base junction that is forward biased;
    a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;
    a plurality of conductive lines coupled with the current source for carrying the current for at least the portion of the plurality of magnetic elements.

2. The system of claim 1 wherein the current source further provides the current having the magnitude that increases as the temperature of the magnetic memory decreases and decreases as the temperature of the magnetic memory increases.

3. The system of claim 1 wherein the current source further includes:
    a control signal source coupled to the at least one temperature sensor, the control signal source providing a control signal based upon the indication of temperature provided by the at least one temperature sensor.

4. The system of claim 3 wherein the control signal source is a voltage source and wherein the control signal is a voltage.

5. The system of claim 1 wherein the at least one temperature sensor includes at least one forward-biased pn junction.

6. The system of claim 1 wherein the temperature sensor has a negative temperature coefficient.

7. The system of claim 1 wherein the current source includes a current mirror.

8. The system of claim 1 wherein any current generated by the current source is temperature dependent.

9. A system for programming magnetic memory including a plurality of magnetic elements, the system comprising:
    at least one temperature sensor for sensing a temperature of the magnetic memory and providing an indication of the temperature of the magnetic memory;
    a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;
    a plurality of conductive lines coupled with the current source for carrying the current for at least the portion of the plurality of magnetic elements;
    wherein the at least one temperature sensor includes at least one thermocouple.

10. A system for programming magnetic memory including a plurality of magnetic elements, the system comprising:
    at least one temperature sensor for sensing a temperature of the magnetic memory and providing an indication of the temperature of the magnetic memory;
    a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;
    a plurality of conductive lines coupled with the current source for carrying the current for at least the portion of the plurality of magnetic elements;
    wherein the at least one temperature sensor includes at least one thermistor.

11. A system for programming magnetic memory including a plurality of magnetic elements, the system comprising:
    at least one temperature sensor for sensing a temperature of the magnetic memory and providing an indication of the temperature of the magnetic memory;
    a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;

a plurality of conductive lines coupled with the current source for carrying the current for at least the portion of the plurality of magnetic elements;

wherein the at least one temperature sensor includes at least one metal structure.

12. The system of claim 11 wherein the at least one metal structure includes at least one platinum film or wire.

13. A system for programming magnetic memory including a plurality of magnetic elements, the system comprising:

at least one temperature sensor for sensing a temperature of the magnetic memory and providing an indication of the temperature of the magnetic memory;

a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;

a plurality of conductive lines coupled with the current source for carrying the current for at least the portion of the plurality of magnetic elements;

wherein the temperature sensor has a positive temperature coefficient.

14. A system for programming magnetic memory including a plurality of magnetic elements, the system comprising:

at least one temperature sensor for sensing a temperature of the magnetic memory and providing an indication of the temperature of the magnetic memory;

a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;

a plurality of conductive lines coupled with the current source for carrying the current for at least the portion of the plurality of magnetic elements;

wherein the current source provides the current that is a linear function of the temperature.

15. A system for programming magnetic memory including a plurality of magnetic elements, the system comprising:

at least one temperature sensor for sensing a temperature of the magnetic memory and providing an indication of the temperature of the magnetic memory;

a current source coupled with the at least one temperature sensor, the current source for providing a current based on the indication of temperature of the magnetic memory, the current being temperature dependent and capable of being used in programming at least a portion of the plurality of magnetic elements without the addition of a separately generated current;

a plurality of conductive lines coupled with the current source for carrying the current for at least the portion of the plurality of magnetic elements;

wherein the current source provides the current that is a nonlinear function of the temperature.

16. A method for programming magnetic memory including a plurality of magnetic elements, the method comprising:

sensing a temperature of the magnetic memory using at least one temperature sensor and providing an indication of the temperature of the magnetic memory, the temperature sensing further including sensing the temperature utilizing at least one diode-connected transistor having at least one emitter-base junction that is forward biased, at least one thermocouple, at least one thermistor, or at least one metal structure;

providing a current based on the indication of temperature of the magnetic memory, the current being temperature dependent and capable of being used in programming at least a portion of the plurality of magnetic elements without the addition of a separately generated current;

carrying the current for at least a portion of the plurality of magnetic elements.

17. The method of claim 16 wherein the current providing step further includes the step of:

increasing the current as the temperature of the magnetic memory decreases and decreasing the current as the temperature of the magnetic memory increases.

18. The method of claim 16 wherein the current providing step further includes the step of:

providing a control signal based upon the indication of temperature provided by the at least one temperature sensor, the control signal controlling the current.

19. The method of claim 18 wherein the control signal providing step further includes the step of:

providing a voltage as the control signal.

20. The method of claim 16 wherein the current is generated by a current source and wherein any current generated by the current source is temperature dependent.

21. A method for programming magnetic memory including a plurality of magnetic elements, the method comprising:

sensing a temperature of the magnetic memory using at least one temperature sensor and providing an indication of the temperature of the magnetic memory;

providing a current based on the indication of temperature of the magnetic memory, the current being temperature dependent and capable of being used in programming at least a portion of the plurality of magnetic elements without the addition of a separately generated current; and carrying the current for at least a portion of the plurality of magnetic elements;

wherein the current providing step further includes the step of:

providing the current that is a linear function of the temperature.

22. A method for programming magnetic memory including a plurality of magnetic elements, the method comprising:

sensing a temperature of the magnetic memory using at least one temperature sensor and providing an indication of the temperature of the magnetic memory;

providing a current based on the indication of temperature of the magnetic memory, the current being temperature dependent and capable of being used in programming at least a portion of the plurality of magnetic elements without the addition of a separately generated current;

carrying the current for at least a portion of the plurality of magnetic elements;

wherein the current providing step further includes the step of:

providing the current that is a nonlinear function of the temperature.

* * * * *